(12) United States Patent
Eurlings et al.

(10) Patent No.: US 6,927,004 B2
(45) Date of Patent: Aug. 9, 2005

(54) MASK FOR USE IN LITHOGRAPHY, METHOD OF MAKING A MASK, LITHOGRAPHIC APPARATUS, AND DEVICE MANUFACTURING METHOD

(75) Inventors: Markus Franciscus Antonius Eurlings, Tilburg (NL); Antonius Johannes Josephus Van Dijsseldonk, Hapert (NL); Marcel Mathijs Theodore Marie Dierichs, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 132 days.

(21) Appl. No.: 10/379,999

(22) Filed: Mar. 6, 2003

(65) Prior Publication Data
US 2003/0180632 A1 Sep. 25, 2003

(30) Foreign Application Priority Data
Mar. 8, 2002 (EP) ............................................. 02251652

(51) Int. Cl.[7] ............................................. G03F 9/00
(52) U.S. Cl. ........................................................ 430/5
(58) Field of Search ............................. 430/5; 382/144; 378/34, 35

(56) References Cited

U.S. PATENT DOCUMENTS

| 5,296,891 A | 3/1994 | Vogt et al. |
| 5,501,925 A | 3/1996 | Smith et al. |
| 5,624,773 A | 4/1997 | Pforr et al. |
| 5,641,593 A | 6/1997 | Watanabe et al. |
| 2001/0051304 A1 | 12/2001 | Stivers et al. |

FOREIGN PATENT DOCUMENTS

EP 0 757 262 A1 2/1997

*Primary Examiner*—S. Rosasco
(74) *Attorney, Agent, or Firm*—Pillsbury Winthrop LLP

(57) ABSTRACT

A reflective mask has a sub-resolution texture applied to absorbing areas to reduce the amount of power in the specular reflection. The texture may form a phase contrast grating or may be a diffuser. The same technique may be applied to the other absorbers in a lithographic apparatus.

17 Claims, 4 Drawing Sheets

MASK FOR USE IN LITHOGRAPHY, METHOD OF MAKING A MASK, LITHOGRAPHIC APPARATUS, AND DEVICE MANUFACTURING METHOD

RELATED APPLICATION

This application claims the benefit of priority to European Patent Application No. 02251652.0, filed Mar. 8, 2002, the entire contents of which are herein incorporated by reference.

BACKGROUND OF THE INVENTION

1. Field of the Invention

The present invention relates to a mask for use in lithography, a method of making a mask, a lithographic apparatus and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

To reduce the size of features that can be imaged, lithographic apparatus using extreme ultraviolet (EUV) radiation, e.g. with a wavelength in the range of from 9 to 16 nm, as the exposure radiation are being developed. At these wavelengths, existing techniques for light manipulation are frequently no longer applicable, for example because they require structures that cannot be scaled down sufficiently. Because no material suitable for making refractive optical elements at such wavelengths is known, EUV lithography apparatus use reflective optical systems and also reflective masks. To create a near-normal incidence mirror for EUV having a high-reflectance it is necessary to use a multilayer stack on a substrate, the multilayer comprising alternating layers of materials having contrasting refractive indices and layer thicknesses tuned to the specific wavelength to be employed. To make a mask, or to obscure part of a mirror, a layer of an absorbing material, such as chrome (Cr) or tungsten (W), tantalum (Ta) or a compound such as tantalum-nitride (TaN) is selectively provided on top of the multilayer stack. In the case of a mask, the absorbing layer is generally deposited to cover the whole of the mask and then photo-lithographically processed and etched away to form the mask pattern. An e-beam writer may also be used. The bright areas of such a mask typically reflect about 65% of the incident radiation while the dark areas reflect less than 0.5%, providing a high contrast. However, if multiple exposures of a dark area overlap, the cumulative dose received by the substrate can be sufficient to cause an undesirable loss of contrast. This can occur when exposing a so-called Focus-Energy Matrix (FEM) for calibration purposes or when exposing a large number of closely packed small dies without reticle masking blades.

SUMMARY OF THE INVENTION

Aspects of the present invention are to avoid or alleviate problems due to loss of contrast caused by radiation reflected firstly by the dark parts of a mask and secondly by other absorbing layers in a lithographic apparatus.

This aspect, and other aspects, are achieved according to the present invention in a reflective mask for use in a lithographic apparatus, the mask having areas of relatively high reflectance and areas of relatively low reflectance defining a mask pattern having a smallest printing feature size, wherein the areas of low reflectance include a layer having a texture at a scale smaller than the smallest printing feature size such that specular reflection from the areas of low reflectance is reduced.

By providing the texture on the areas of low reflectance (dark areas), the specular reflection from these areas is reduced, as compared to the case if the dark areas were smooth. In the past, the absorbent layer in a mask has been deposited by methods which provide an optically smooth (at the wavelength of the projection beam) upper surface and the dark areas are protected by resist during subsequent etching to form the mask pattern. The dark areas therefore remain smooth. Therefore, a high proportion of the incident radiation that is not absorbed is directed into the specular reflection, enters the projection system and is directed onto the substrate. The texture applied according to the present invention has a scale smaller than the smallest feature size in the mask pattern and spoils that optical smoothness thereby reducing the specular reflection from the dark areas. It should be noted that the texture may be on a scale sufficiently small compared to the wavelength of visible light that the dark areas will still appear smooth to the naked eye.

It is well known that a mask may have printing features, i.e. features that will be printed when the mask is used in a lithographic process, as well as non-printing features, also referred to as sub-resolution features, that do not appear directly in the printed pattern but affect the shape and/or position of the printed features. Such features include optical proximity correction elements, serifs, scattering bars, etc. The texture of the invention must have a smaller scale than the printing features but not necessarily smaller than the non-printing features.

In an embodiment of the present invention, the texture includes a phase grating. The grating includes lands and recesses causing a relative phase shift of substantially π radians, which can be achieved by providing a height difference between the lands and recesses substantially equal to one quarter of the wavelength of the exposure radiation.

The lands and recesses may each occupy close to 50% of the total area of the areas of relatively low reflectance to provide maximum suppression of the specular reflection.

The pitch of such a phase grating is chosen so that the first order (and higher) diffracted beams lie outside the pupil of the projection system. In this way the undesired light entering the projection system can be reduced to substantially zero. Accordingly, the pitch, p, of the phase grating at substrate level should satisfy the inequality:

$$p < \frac{\lambda}{(1+\sigma).NA.|M|}$$

where λ is the wavelength of the exposure radiation and NA, M and σ are respectively the numeric aperture, magnification and pupil filling ratio of the projection system. If the pupil filling ratio to be used is not known when the mask is made, it can be assumed to be 1 to ensure the first order lies outside the pupil of the projection system.

The exact form of the grating may depend on the mask pattern. The grating may be two-dimensional to avoid undesired effects that may occur if lines of a one-dimensional grating were to line up with linear features of the mask pattern. However, for mask patterns with no linear features or linear features extending in only one or a limited number or range of directions, a one-dimensional grating structure that crosses the lines of the mask pattern may be employed.

In an alternative embodiment of the present invention, the dark areas are treated to act as a diffuser for diffusing the reflected radiation into a large solid angle. This will still reflect some radiation into the projection system but the larger the solid angle into which the radiation is diffused, the smaller the fraction entering the projection system. To act as a diffuser, a random or pseudo-random pattern may be applied to the absorbing layer. This may be accomplished by chemical or mechanical roughening of the surface of the absorbing layer or by suitable manipulation of the deposition process, e.g. by introduction of contaminants. It is possible to construct the absorbing layer so that additional scattering occurs throughout the interior of the layer. Layers of relatively large thickness are more effective in this regard but introduce undesirable defocussing effects. A solution is to make the absorbing layer granular in order to achieve a large number of internal boundaries which increase the scattering.

Materials that are particularly effective as absorbing layers are tantalum (Ta) and tantalum-nitride (TaN).

The present invention also provides a device manufacturing method including providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material using a projection system, wherein using the patterning device includes positioning a mask having areas of relatively high reflectance and areas of relatively low reflectance defining the pattern, wherein the areas of low reflectance comprise a layer having a surface texture at a scale smaller than the smallest printing feature in the pattern resolvable on the substrate by the projection system.

Another aspect of the present invention is achieved in a lithographic projection apparatus including a radiation system constructed and arranged to supply a projection beam of radiation; a support structure constructed and arranged to support a patterning device, the patterning device constructed and arranged to pattern the projection beam according to a desired pattern; a substrate table constructed and arranged to hold a substrate; a projection system constructed and arranged to projecting the patterned beam onto a target portion of the substrate; an optical element included in the radiation system or the projection system, at least a part of which is provided with an absorbing layer, wherein the absorbing layer of the optical element is provided with a texture at a scale smaller than the smallest feature size resolvable by the projection system such that specular reflection from the absorbing layer is reduced.

In this way, the same inventive concept that is applied to masks may be used to reduce unwanted reflections from other optical elements that are at least partly absorbing. Such elements may include mirrors in the radiation system that are partially obscured to define the beam shape, the illumination field shape or other illumination settings, blades for masking areas of another optical element, such as a reticle, as well as spatial filters, pupil or aperture stops and blades for defining the numeric aperture.

According to a further aspect of the invention there is provided a device manufacturing method including providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material; and absorbing a part of the projection beam in an absorbing layer provided on an optical element, the absorbing layer of the optical element being provided with a texture at a scale smaller than the smallest feature size resolvable by the projection system such that specular reflection from the absorbing layer is reduced.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
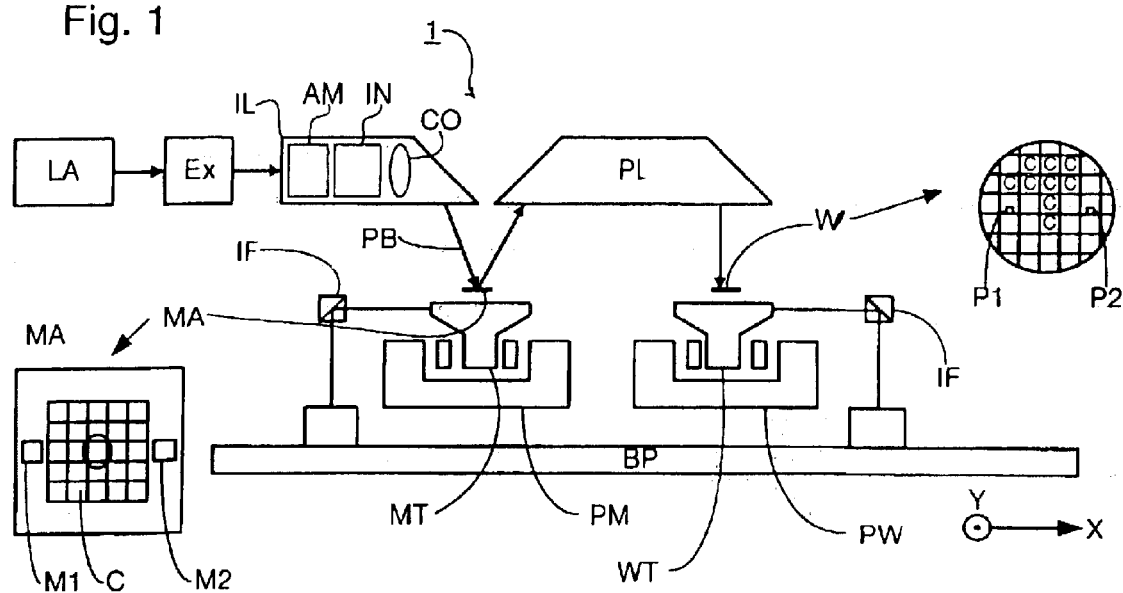
FIG. 1 depicts a lithographic projection apparatus in which masks according to embodiments of the present invention may be used.

FIG. 1 schematically depicts a lithographic projection apparatus 1 according to an embodiment of the invention. The apparatus 1 includes a base plate BP; a radiation system, Ex, IL constructed and arranged to supply a projection beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:
1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
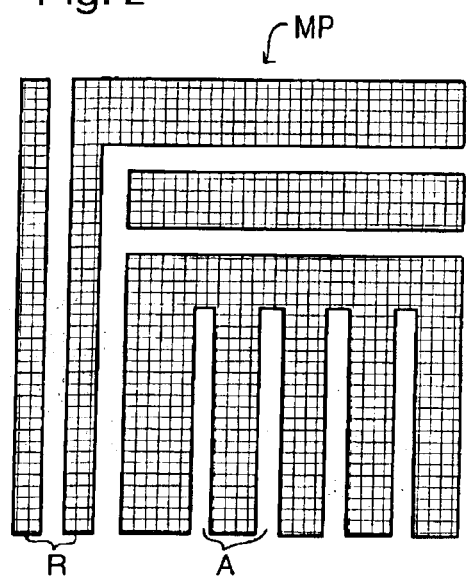
FIG. 2 depicts an example of a mask pattern used in the present invention.

The mask MA has a mask pattern MP defined by a plurality of reflective and absorbing areas R, A, respectively, as shown, by way of example, in FIG. 2. The mask MA may be formed by removing, e.g. by etching, in the reflective areas R, an absorbing layer provided on top of a multilayer stack optimized for reflection at the expected angle of incidence and wavelength of the projection beam. The absorbing areas A are where the absorbing layer is left behind.

Figure 3:
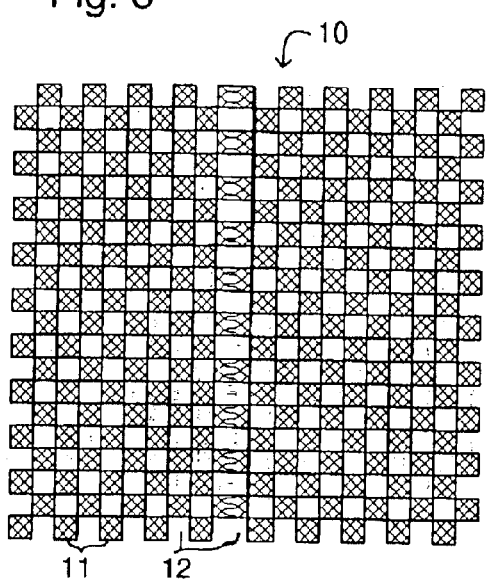
FIG. 3 depicts a sub-resolution pattern applied to a mask according to an embodiment of the present invention.

According to one embodiment of the present invention, the surface of the absorbing layer is provided with a texture 10 formed by lands 11 and recesses 12 in a checkerboard pattern, as shown in FIG. 3. The lands 11 and recesses 12 have a pitch smaller than the smallest feature size appearing in the mask pattern MP and/or resolvable by the projection system PL at substrate level and generally are arranged in a two-dimensional pattern to form a two-dimensional phase grating. To maximize the phase contrast, the height difference between the lands 11 and recesses 12 is preferably substantially one quarter of the wavelength of the radiation of the projection beam PB.

Figure 4:
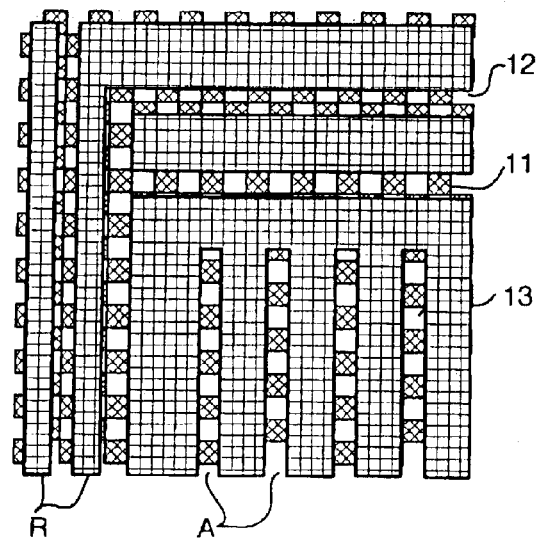
FIG. 4 depicts the mask pattern of FIG. 2 overlaid on the sub-resolution pattern of FIG. 3.

FIG. 4 shows the result of the combination of the mask pattern MP and the sub-resolution phase grating 10. In the reflective areas R, the mu absorbing areas A the sub-resolution phase grating 10 can be seen on the surface of the absorbing layer. It should be noted that the exact shape, position and orientation of the sub-resolution phase grating 10 may vary, provided that at least a one-dimensional phase-contrast grating is apparent in each of absorbing areas A. It will be appreciated that the texture 10 and the mask pattern MP are not shown to scale in FIGS. 2, 3 and 4.

Figure 5:
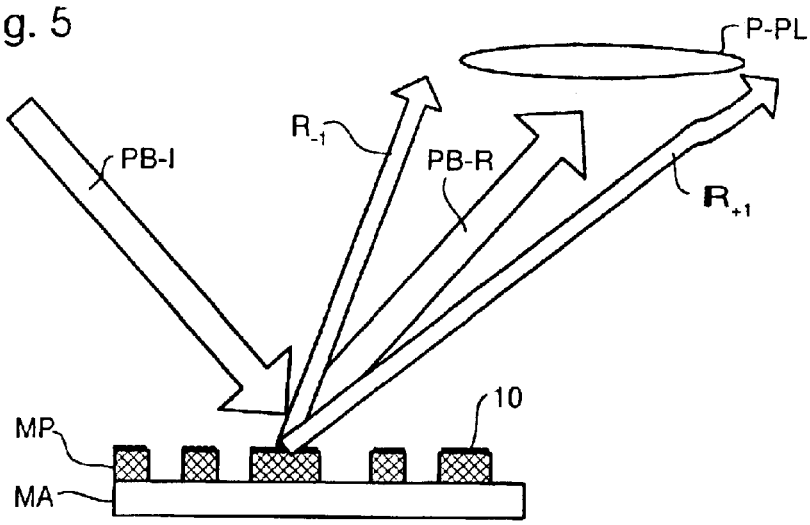
FIG. 5 is a diagram illustrating the use of a mask according to the first embodiment.

FIG. 5 illustrates how the mask MA functions. (It should be noted that the angles shown in FIG. 5 are chosen for illustrative purposes only and in an actual embodiment of the present invention the projection beam will be incident at an angle much closer to the normal.) The projection beam PB-I is projected onto the mask MA by illumination system IL and reflected to form a patterned projection beam PB-R which enters the pupil P-PL of the projection system PL. The majority of the energy in the projection beam PB-I that is incident on the absorbing areas A in the mask pattern MP is absorbed. Some energy is however reflected. Because of the sub-resolution phase grating 10 provided on the upper surface of the absorbing areas A, the radiation reflected by the absorbing areas A is diffracted rather than simply specularly reflected. By ensuring that the ratio of the total areas of lands 11 and of recesses 12 is as close a possible to 1 and that the relative phase difference between radiation reflected from the lands 11 and from the recesses 12 is π radians, the $0^{th}$-order beam (specular reflection) is suppressed and substantially all of the radiation is directed into the $1^{st}$-order diffracted beams $R_{-1}$, $R_{+1}$ and higher orders. The radiation reflected from the absorbing areas A is thus spatially separated from the patterned projection beam PB-R. By appropriate choice of the pitch of the sub-resolution phase grating 10 it can be ensured that the $1^{st}$ (and higher)-order diffracted beams lie outside the pupil of the projection lens P-PL and so are not imaged on the substrate. The dose delivered to dark areas of the substrate is therefore substantially reduced.

From the diffraction equation, it can be derived that for the $1^{st}$ orders to lie outside the pupil of the projection system, the pitch p of the sub-resolution phase grating 10 must satisfy the following inequality:

$$p < \frac{\lambda}{(1+\sigma).NA.|M|}$$

where λ is the wavelength of the exposure radiation in projection beam PB, and σ is the pupil filling ratio, NA is the numerical aperture and M is the magnification of the projection system PL.

As mentioned above, it is desirable to entirely suppress the specular reflection from the absorbing areas A which is achieved by arranging for the phase difference Δφ between the radiation reflected from the lands 11 and from the recesses 12 to be equal to π radians and for the ratio of total area of lands 11 to total area of recesses 12 to be 1. The latter condition may also be expressed as the sub-resolution phase grating 10 having a duty ratio DR of 0.5.

Figure 6:
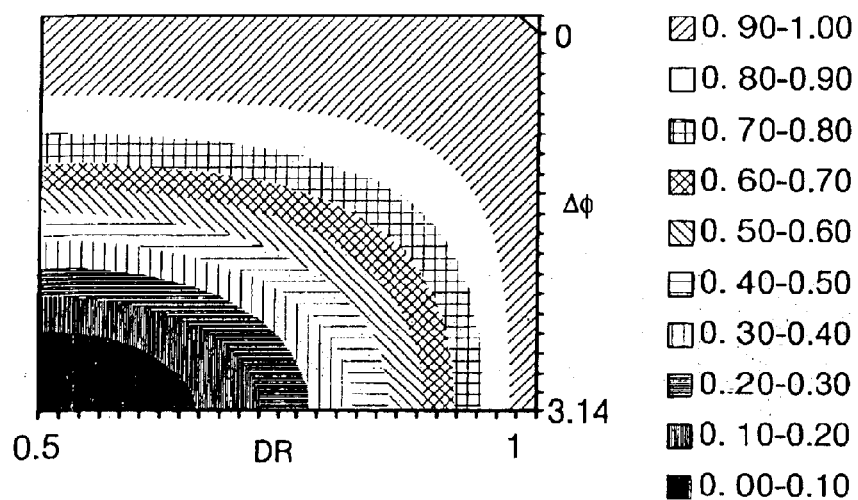
FIG. 6 is a graph showing the relative power in the specular reflection as a function of the duty ratio and the phase step of the sub-resolution pattern.

Nevertheless, a substantial and desirable reduction in the power contained in the specular reflection can be achieved even if the phase difference Δφ and duty ratio DR deviate substantially from their preferred values. FIG. 6 shows the proportion S of the total power reflected by absorbing areas A that is contained in the specular reflection as a function of the phase difference Δφ and the duty ratio DR of the phase grating 10. It can be seen that a relatively large phase error, within ±π/5 of the preferred phase step of π, still results in 90% attenuation of the $0^{th}$-order. Such a phase error is equivalent to a 0.7 nm depth error on a step of 3.4 nm, for λ=13.5 mn. Thus, the present invention can provide substantial advantages even with relatively high tolerances in the manufacture of the sub-resolution phase grating 10.

Figure 7:
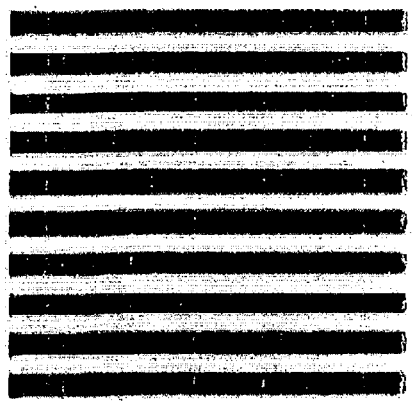
FIGS. 7 and 8 show first and second standing wave patterns used to expose a resist in a method of making a mask according to an embodiment of the present invention.
Figure 8:
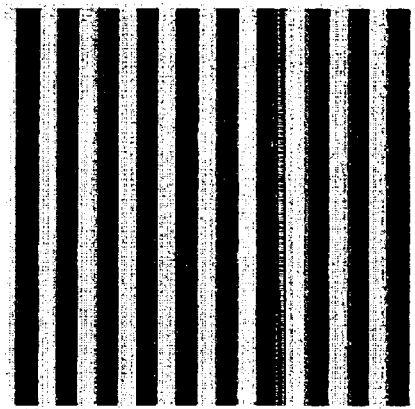
Figure 9:
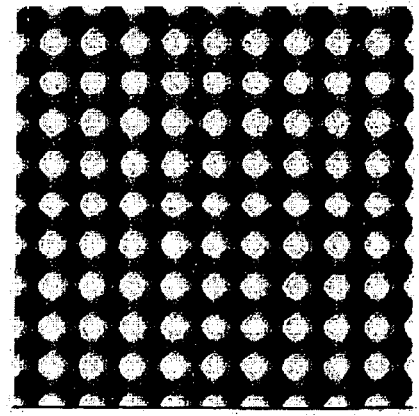
FIG. 9 shows the combined image resulting from the exposures of the standing wave patterns of FIGS. 7 and 8.
Figure 10:
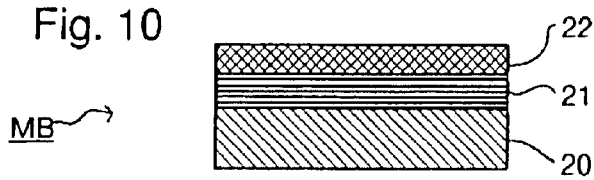
FIGS. 10 to 13 illustrate steps in a method of making a mask according to an embodiment of the present invention.
Figure 11:
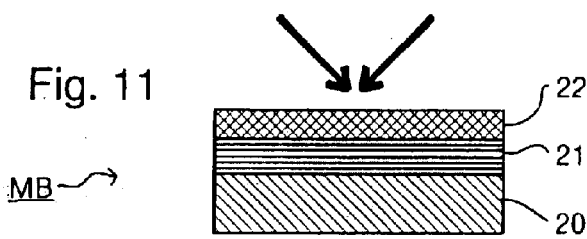

A suitable sub-resolution phase grating 10 can be formed relatively simply by etching the checkerboard pattern, as shown in FIG. 3, in the top surface of the absorbing layer before the absorbing layer is selectively removed to form the mask pattern MP. To do this, it is first necessary to expose a resist layer provided in top of the absorbing layer in a suitable pattern. It is known to expose a resist to form a linear grating by irradiating it with two coherent beams of radiation which are mutually inclined so that interference between the two beams forms a standing wave pattern in the resist. FIG. 7 shows the intensity distribution of such a standing wave pattern. The pitch of this pattern is determined by the wavelength of the radiation used for the exposure and the angle of inclination of the two beams. According to the present invention, the resist is also exposed with a second standing wave pattern, shown in FIG. 8, oriented at 90° to the first standing wave pattern giving a total exposure as shown in FIG. 9. The angle between the two standing wave patterns can be less than 90°, which will result in a grating having different pitches in orthogonal directions, which is acceptable provided the layer of the pitches is sufficiently small. It will be appreciated that the complete exposure can be effected in one exposure using four beams or in two exposures using two beams and a relative rotation between the beams and the mask blanks between steps.

Figure 12:
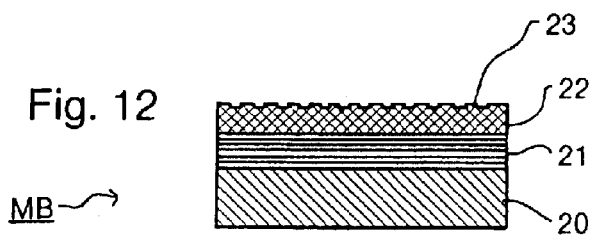

FIGS. 10 to 13 illustrate the mask production process. A mask blank MB includes a substrate 20, a multilayer stack 21 optimized for reflectivity at the wavelength of the projection radiation and an absorbing layer 22 which covers the entire upper surface of the mask blank MB. This is initially coated with a resist (not shown) which is exposed as described above with orthogonal standing wave patterns. The exposed resist is developed to form a checkerboard pattern and the exposed areas of the absorbing layer 22 are etched to a depth equal to one quarter of the wavelength of the radiation of the projection beam so as to define a sub-resolution pattern 23, as shown in FIG. 12.

Figure 13:
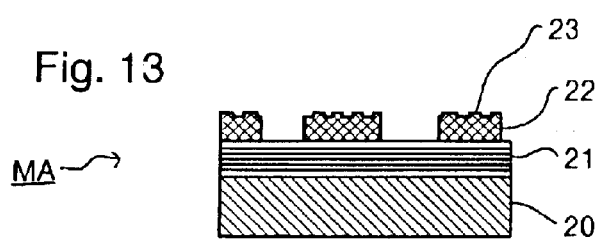

To create the mask pattern MP, the absorbing layer 22 is again covered by a resist which is exposed to define the mask pattern, e.g. using projection lithography or an e-beam direct writer. The resist is developed and the absorbing layer 22 is etched away completely to form the reflective areas of the mask pattern MP. Thus, the mask MA as shown in FIG. 13 has areas where the multilayer stack 21 is exposed and areas where it is covered by absorbing layer 22, which retains a sub-resolution pattern 23 in its upper surface.

The sub-resolution pattern 23 may of course be formed by other processes and may be formed at the same time as the mask pattern MP or in advance on the mask blank MB. Other processes to form the sub-resolution pattern 23 include exposing a resist with a suitable pattern (using for example a lithographic apparatus, an e-beam direct writer, an ion-beam direct writer or by X-ray contact or proximity printing) then developing the resist and etching the underlying absorbing layer 22. The sub-resolution pattern 23 can also be formed directly in the absorbing layer 22 by such techniques as embossing or ion-beam etching.

Figure 14:
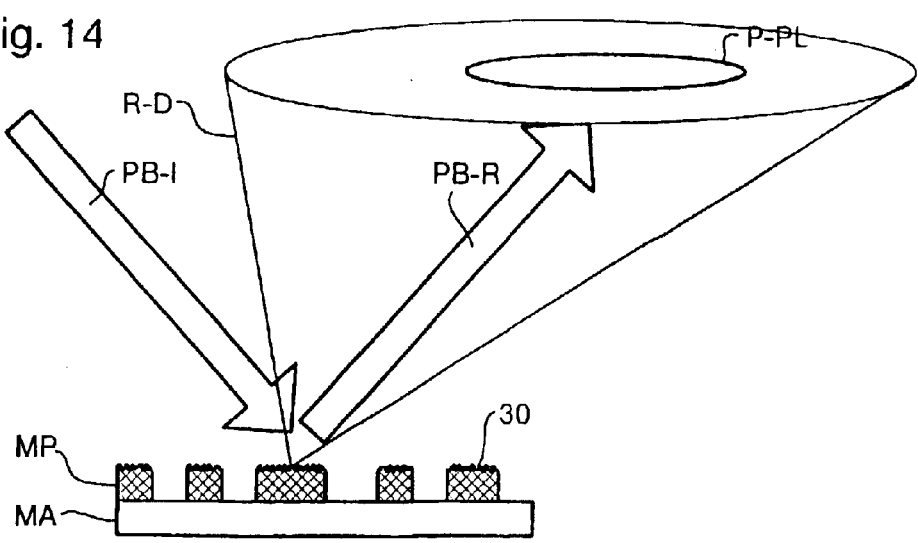
FIG. 14 is a diagram illustrating the use of a mask according to a second embodiment of the present invention.

In another of the present invention the texture applied to the absorbing layer forms a diffuser rather than a phase-contrast grating. The functioning of a mask MA according to this embodiment of the present invention is shown in FIG. 14.

The incident projection beam is patterned and reflected by the mask pattern MP provided on the mask MA and the patterned, reflected beam PB-R is captured by the pupil P-PL of the projection system PL. The radiation reflected from the dark areas is diffused into a cone R-D having a large solid angle compared to the numerical aperture of the projection system PL by the action of the diffuser formed by the texture 30 in the absorbing areas of the mask pattern MP. Clearly, in this embodiment of the present invention, some light reflected from the dark areas of the mask pattern MP does enter the projection system PL but the proportion doing so can be reduced substantially by arranging that the solid angle into which light is diffused is as large as possible.

To act as a diffuser, the texture 30 of the absorbing layer could be given a random or pseudo-random texture. This can be achieved lithographically or by chemical or mechanical roughening of the surface of the absorbing layer before the mask pattern MP is formed. It is also possible to provide the necessary roughness by appropriate manipulation of the creation, e.g. by deposition, of the absorbing layer. The absorbing layer may be designed to cause scattering internally as well as at the surface. This can be achieved by introducing a large number of optical boundaries, i.e. changes in refractive index, into the interior of the absorbing layer, possibly by making the absorbing layer granular.

Where the absorbing layer is formed by deposition the roughness can be achieved by manipulation of such parameters as the pressure and temperature of the deposition process as well as the evaporation or sputtering rate or by the introduction of contaminants.

The appropriate degree of roughness to produce the desired effect can be determined from the following equation:

$$F = 1 - \exp\left[-\left(\frac{4\pi}{\lambda}\right)^2 \sigma^2\right]$$

where F is the proportion of the incident radiation that is diffusely, rather than specularly, reflected λ is the wavelength of the radiation and σ the rms surface roughness. For radiation at 13.5, an rms surface roughness of 1 nm gives 57% diffuse reflection while 2 nm gives 97% flare.

While specific embodiments of the invention have been described above, it will be appreciated that the invention may be practiced otherwise than as described. The description is not intended to limit the invention.

What is claimed is:

1. A reflective mask for use in a lithographic apparatus, the mask having areas of relatively high reflectance and areas of relatively low reflectance defining a mask pattern having a smallest printing feature size, wherein the areas of low reflectance comprise a layer having a texture at a scale smaller than the smallest printing feature size such that specular reflection from the areas of low reflectance is reduced.

2. A mask according to claim 1, wherein the texture comprises a phase grating.

3. A mask according to claim 2, wherein the grating comprises lands and recesses such that there is a phase shift of substantially π radians between exposure radiation reflected from the lands and from the recesses.

4. A mask according to claim 3, wherein the ratio of the total area of the lands to the total area of the recesses is in the range of from 2/3 to 3/2.

5. A mask according to claim 2, wherein the phase grating has a pitch such that first order diffracted beams lie outside a pupil of a projection system of the lithographic apparatus.

6. A mask according to claim 2, wherein the phase grating is two-dimensional.

7. A mask according to claim 1, wherein the texture forms a diffuser for diffusing the reflected radiation into a large solid angle compared to a numerical aperture of a projection system of the lithographic apparatus.

8. A mask according to claim 7, wherein the texture is a surface texture.

9. A mask according to claim 7, wherein the texture is internal and includes a plurality of differently oriented boundaries.

10. A mask according to claim 9, wherein the layer is formed of a granular material.

11. A mask according to claim 1, wherein the layer is formed from at least one of tantalum (Ta) and tantalum-nitride (TaN).

12. A mask according any one of claim 7, wherein the texture has an rms roughness of greater than or equal to 1 nm.

13. A device manufacturing method, comprising:

providing a substrate that is at least partially covered by a layer of radiation-sensitive material;

providing a projection beam of radiation using a radiation system;

using a patterning device to endow the projection beam with a pattern in its cross-section;

projecting the patterned beam of radiation onto a target portion of the layer of radiation-sensitive material using a projection system, wherein using the patterning device comprises:

positioning a mask having areas of relatively high reflectance and areas of relatively low reflectance defining the pattern and the areas of low reflectance comprise a layer having a surface texture at a scale smaller than the smallest printing feature in the pattern resolvable on the substrate by a projection system.

14. A method according to claim 13, wherein the texture comprises a phase grating comprising lands and recesses such that there is a phase shift of substantially π radians between radiation of the projection beam reflected from the lands and from the recesses.

15. A method according to claim 14, wherein the phase grating has a pitch, p, that satisfies the following inequality:

$$p < \frac{\lambda}{(1+\sigma) \cdot NA \cdot |M|}$$

where λ is the wavelength of the radiation of the projection beam and σ is the pupil filling ratio, NA is the numerical aperture of the projection system and M is the magnification of the projection system.

16. A lithographic projection apparatus, comprising:

a radiation system constructed and arranged to supply a projection beam of radiation;

a support structure constructed and arranged to support a patterning device, the patterning device constructed and arranged to pattern the projection beam according to a desired pattern;

a substrate table constructed and arranged to hold a substrate;

a projection system constructed and arranged to project the patterned beam onto a target portion of the substrate;

an optical element included in the radiation system or the projection system, at least a part of which is provided with an absorbing layer, wherein the absorbing layer of the optical element is provided with a texture at a scale smaller than the smallest feature size resolvable by the projection system such that specular reflection from the absorbing layer is reduced.

17. A device manufacturing method, comprising:

providing a substrate that is at least partially covered by a layer of radiation-sensitive material;

providing a projection beam of radiation using a radiation system;

using a patterning device to endow the projection beam with a pattern in its cross-section;

projecting the patterned beam of radiation onto a target portion of the layer of radiation-sensitive material; and absorbing a part of the projection beam in an absorbing layer provided on an optical element, the absorbing layer of the optical element being provided with a texture at a scale smaller than the smallest feature size resolvable by the projection system such that specular reflection from the absorbing layer is reduced.

* * * * *